Oct. 5, 1965 T. G. STEHNEY 3,210,560

SEMICONDUCTOR DEVICE

Filed April 17, 1961

WITNESSES:

Edwin E. Bassler

James F. Young

INVENTOR

Thomas G. Stehney

BY V. H. Cleary

ATTORNEY 3,210,560

SEMICONDUCTOR DEVICE

Thomas G. Stehney, Rillton, Pa., assignor to Westinghouse Electric Corporation, East Pittsburgh, Pa., a corporation of Pennsylvania Filed Apr. 17, 1961, Ser. No. 103,583
5 Claims. (Cl. 307—88.5)

This invention relates to a semiconductor switch and more specifically to a three terminal semiconductor switch.

In the conventional three terminal semiconductor switch, such as the p-n-p-n or n-p-n-p type, a signal is applied between one of the two intermediate base regions and the adjacent outer region to render the switch conductive. In these devices, the switch is rendered conductive by a relatively small voltage so that the firing of the device by the intermediate base or gate connection is usually quite sensitive and is susceptible to firing by extraneous signals.

Hence, an object of the invention is to provide a semiconductor switch which is not sensitive to extraneous signals to be rendered conductive.

Another object of the invention is the provision of a semiconductor switch having three terminals, which can be rendered conductive by application of a predetermined voltage between two terminals, with a maximum of accuracy.

Still another object of the invention is the provision of a four region semiconductor switch which requires a relatively large voltage between one of the intermediate regions and one of the outer regions to render the device conductive.

Other objects and advantages of the invention will become apparent by a reading of the following specification and an examination of the attached drawing, in which.

Figure 1:
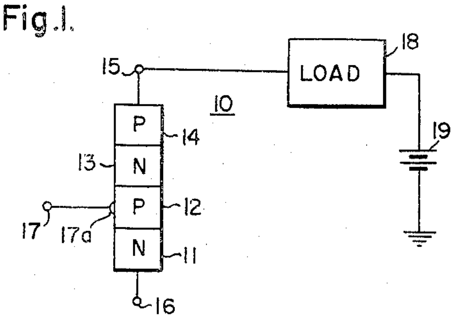
FIGURE 1 illustrates a circuit including a semiconductor switch.
Figure 2:
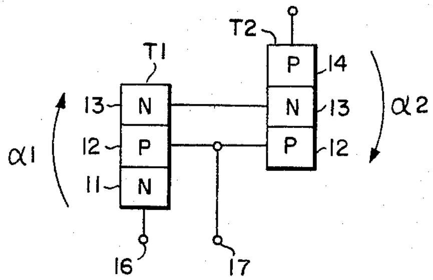
FIGURE 2 illustrates an equivalent diagram of the switch shown in FIG. 1.

The invention relates broadly to an improvement in a four layer or four region semiconductor switch such as a p-n-p-n or an n-p-n-p type. A four region semiconductor switch, having three terminals, an anode terminal, a cathode terminal, and a gate terminal effectively operates as two transistors of opposite conductivity type. An example of such a four layer, three terminal device is illustrated in FIGURE 1 which includes a schematic diagram of the p-n-p-n three terminal device illustrated as numeral 10 in FIGURE 1. This device comprises a first outer region 11 forming an n-type region, a first inner region 12 formed of a p-type conductivity material, a second inner region 13 of an n-type material and a second outer region 14 of a p-type conductivity material. The semiconductor switch 10 has an anode terminal 15, a cathode terminal 16 and a gate terminal 17 which is connected to the first inner base region 12. The equivalent diagram of this four layer or four region device is shown schematically in FIGURE 2 which effectively operates as two complementary transistors, one being an n-p-n type consisting of regions 11, 12 and 13 and the other a p-n-p type comprising regions 12, 13 and 14. FIGURE 1 shows the four region device connected in series with the load 18 in a direct current voltage source 19. By applying a positive voltage of sufficient magnitude between the gate terminal 17, and the cathode terminal 16 the semiconductor switch will be rendered conductive. As shown in FIGURE 2, the equivalent of this circuit is two transistors, T1 which is an n-p-n type and T2 which is a p-n-p type. When the current applied between the gate terminal 17 and the cathode terminal 16 is sufficiently positive to increase the $a1$ of the n-p-n transistor, the $a1$ of T1 plus $a2$ of T2 will be greater than one and the device will be rendered conductive.

As shown in FIGURE 2 the second inner region 13 operates as both the collector for the equivalent transistor T1 and the base electrode for the equivalent transistor T2. Additionally, the first inner region 12 operates as a base electrode for the equivalent transistor T1 and as the collector electrode for the equivalent transistor T2. $a1$ illustrated in FIGURE 2 is the current amplification factor of the current between the emitter and collector of the equivalent transistor T1 whereas $a2$ is the current amplification factor between the emitter and collector of the equivalent transistor T2. When the current applied between the gate terminal 17 and the emitter or cathode terminal 16 is sufficiently positive the device will be rendered conductive by increasing $a1$ so that $a1$ plus $a2$ is greater than one.

In the conventional four layer, three terminal semiconductor switch, the voltage required between the gate terminal 17 and the emitter terminal 16, to render the device conductive, is usually quite small and is susceptible to firing by extraneous signals. Further, this relatively small firing voltage results in a relatively small percentage of tolerance or error when firing the switch due to its relatively high sensitivity. More specifically, since the device is responsive to relatively low gate signals to be fired, the relatively small percentage of error in the input gate signal will materially effect the desired firing time of the switch so that the switch may fire at an incorrect time position in the circuit in which it operates. In the present invention, however, a four layer, three terminal device is disclosed wherein the gate is not highly sensitive and susceptible to firing by extraneous signals or by signals applied to the gate which are slightly inaccurate but rather fires only by a relatively high constant gate voltage so as to provide a relatively high degree of tolerance in firing the device.

Figure 6:
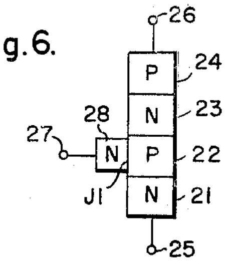
FIGURE 6 illustrates a schematic diagram of the embodiment of the invention illustrated in FIGURES 1, 2, and 3.
Figure 7:
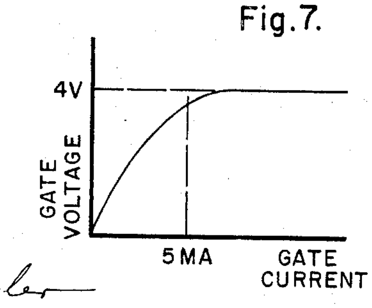
FIGURE 7 illustrates a graph used for explaining the invention.

As shown in FIGURE 1, the conventional four layer p-n-p-n three terminal semiconductor switch has a gate terminal 17 which is connected to the first inner region 12 by an ohmic contact 17*a*. An equivalent diagram of an embodiment of the present invention is illustrated in FIGURE 6 having a first outer region 21 of the *n* conductivity type material, a first inner region 22 of p-type conductivity material, a second inner region of n-type conductivity material 23, and a second outer region 24 of a p-type conductivity material. The anode terminal 26 is connected to the second outer region 24 by an ohmic non-rectifying contact as is the emitter or cathode terminal 25 connected to the first outer region 21 by an ohmic non-rectifying contact. In the embodiment of the invention illustrated in FIGURE 6, however, the gate terminal 27 is not connected directly to the first inner base region 22 but is rather connected to an n-type region 28 which forms a rectifying junction J1 with the first inner base region 22. Hence, when a positive signal is applied between a gate terminal 27 and the emitter terminal 25, this gate signal will tend to back bias the junction J1, and the junction J1 will of course tend to block the current of the signal between the terminals 27 and 28. If the junction J1 is heavily doped the gate voltage and current necessary to fire the switch will be relatively low. If the junction J1 has relatively light doping, the gate voltage and current necessary to fire the four region switch will be relatively high. By utilizing this avalanche breakdown to fire the four region device the gate current will increase gradually so that the device can be fired accurately and the gate will not be sensitive to extraneous signals to be fired. A typical graph of the characteristic of this junction to fire the four region device is illustrated in FIGURE 7 for the gate voltage as plotted against the gate current. Tests were made and depending upon the doping of the junction J1, the device was fired with a gate voltage of between three and five volts with the firing gate current being approximately 5 milliamperes.

Figure 3:
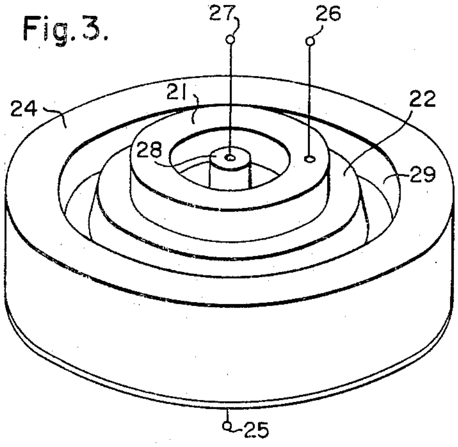
FIGURE 3 illustrates a perspective, isometric view of an embodiment of the invention.
Figure 4:
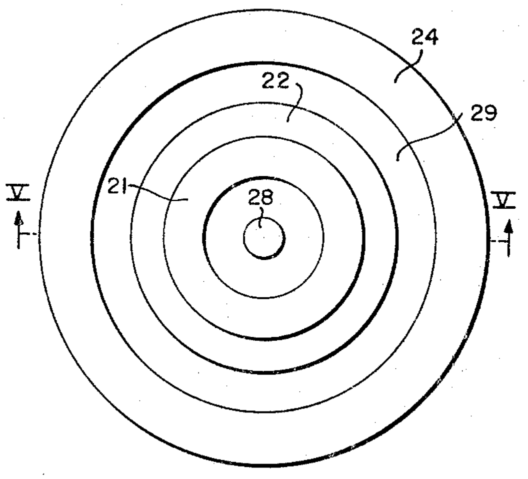
FIGURE 4 illustrates a plan view of the embodiment of the invention illustrated in FIGURE 1.
Figure 5:
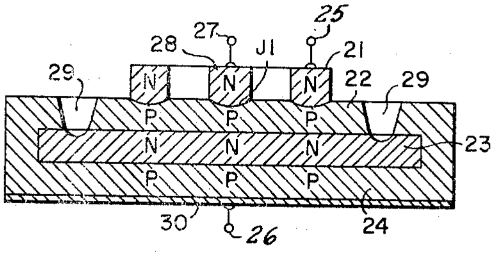
FIGURE 5 illustrates a cross-section view of the device illustrated in FIGURE 2.

FIGURE 3 illustrates an isometric view of an embodiment of the invention, FIGURE 4 illustrates a plan view of this embodiment and FIGURE 5 illustrates a cross-sectional view taken along the lines A—A of FIGURE 4. As shown in these figures the device comprises a first outer region of n-type conductivity 21 which is annular or ring shaped. The annular or ring shaped n-type emitter 21 forms a rectifying alloy contact with a circular first inner base region 22. This first inner base region is of p-type conductivity materials and forms a rectifying contact with a circular second inner base region 23. The circular base region 23 froms a rectifying contact with a circularly shaped p-region 24 having a circularly shaped periphery so that the junction extends upwardly on the sides or periphery of the n-type region 23 and inwardly over a portion of the top edge of the circular region 23. A circular groove 29 is etched to provide space in between the p-type conductivity material 22 and the p-region 24. An ohmic contact is made between the anode terminal 25 and the second outer p-region 24. Likewise an ohmic contact is made between the emitter terminal 23 and the n-type conductivity region 21.

The gate terminal 27 is connected by an ohmic contact to an n-type material or region 28 which forms a rectifying junction, J1, with the p-region 22. This junction can be doped heavily on both sides so that the junction has a very low breakdown voltage as shown in FIGURE 7. The current increase through the gate is gradual as shown in FIG. 7 to provide for more accurate control and firing of the device. In the devices constructed, a gate firing voltage from three to twenty-two volts was achieved with a gradual increase in current before break over, turning off anode to cathode voltages of from 400 to 500 volts.

In one device constructed a circular n-type silicon crystal having an impurity concentration of $10^{15}$ atoms/cc. was diffused with gallium. This silicon crystal was 450 mils in diameter and 8.5 mils thick. The gallium was diffused into the crystal to produce a p-region 2 mils deep with a surface concentration of $10^{18}$ atoms/cc. A groove 29 concentric with the crystal was formed 400 mils in diameter, 20 mils wide and 4 mils deep. The emitter ring 21 and gate 28 were made of n-type gold with $10^{19}$ atoms/cc. of antimony. The n-type emitter and gate were alloyed into the base region 22.5 mil. The device was tested and 4 volts were required on the gate to fire an anode to cathode voltage of 450 volts.

Other devices also tested include a device constructed in the same manner as above except the diffusing element was aluminum which was diffused into the silicon crystal to a surface concentration of $10^{16}$ atoms/cc. When this device was tested it required 22 volts to turn off 450 volts across the device.

In both of the above devices the gate 28 had a diameter of 95 mils and was mounted concentric with the crystal. The emitter 21 had an inside diameter of 105 mils and an outside diameter of 350 mils.

Thus the gate voltage required to fire the device ($V_{BR}$) equals $40\times\rho^{3/4}$ where $\rho$ is the resistivity and equals $1/NQ\mu$ where N equals carrier concentration in atoms/cc.; Q equals charge on electron and $\mu$ equals mobility.

Although the invention has been described in connection with the specific embodiment, it will be apparent to those skilled in the art that changes in arrangements and parts can be made to suit the requirement without departing from the spirit and scope of the invention.

I claim as my invention:

1. A semiconductor switch comprising a semiconductor member having at least four alternating regions of p-type and n-type conductivity material to form a first outer region, a first inner region, a second inner region and a second outer region, joined seriatim, a first terminal having an ohmic contact with said first outer region, a second terminal having an ohmic contact with said second outer region, and a third terminal having a rectifying junction with said first inner region spaced from said first outer region; means electrically coupled to said first and third terminals to reverse bias said rectifying junction sufficient to produce breakdown of said junction and to place said switch in the conductive state.

2. A semiconductor switch comprising a semiconductor member having at least four alternating regions of p-type and n-type conductivity material to form a first outer region, a first inner region, a second inner region and a second outer region joined seriatim to provide three rectifying junctions, and a fifth region spaced from said first outer region to provide a fourth rectifying junction with said first inner region; means to apply a signal to said fifth region to reverse bias said fourth rectifying junction sufficiently to produce breakdown thereof and to place said switch in the conductive state.

3. A semiconductor switch comprising a semiconductor member having four alternating regions of p-type and n-type conductivity material to form a first outer region of one conductivity type forming a rectifying junction with a first inner region of the opposite conductivity type, a second inner region of said one conductivity type forming a rectifying junction with said first inner region, a second outer region of said opposite conductivity type forming a third rectifying junction with said second inner region, a fifth region of said one conductivity type forming a fourth rectifying junction with said first inner region, a first terminal being electrically connected to said first outer region, a second terminal being electrically connected to said second outer region, and a third electrical connection being connected to said fifth region, means to apply a signal to said fifth region to reverse bias said fourth rectifying junction sufficiently to produce breakdown thereof and to place said switch in the conductive state.

4. A semiconductor switch comprising a semiconductor member having four alternating regions of p-type and n-type conductivity material to form a first outer region of one conductivity type, a first inner region of the opposite conductivity type forming a first rectifying junction with said first outer region, a second inner region of said one conductivity type forming a second rectifying junction with said first inner region, a second outer region of said opposite conductivity type forming a third rectifying junction with said second inner region, a fifth semiconductive region of said one conductivity forming a fourth junction with said first inner region with said junction being of a relatively low resistivity and heavily doped; means to apply a signal to said fifth region to reverse bias said fourth rectifying junction sufficiently to produce breakdown thereof and to place said switch in the conductive state.

5. A semiconducor switch comprising a semiconductor member having four alternating regions of p-type and n-type conductivity material to form three discrete rectifying junctions including a first outer region of one conductivity type, a first inner region of an opposite conductivity type forming a first rectifying junction with said first outer region, a second inner region of said one conductivity type forming a second rectifying junction with said first inner region, a second outer region of said opposite conductivity type forming a third rectifying junction with said second inner region, a first terminal having an ohmic electrical contact with said first inner region, a second terminal having an ohmic contact with said second outer region, a fifth region forming a fourth rectifying junction with said first inner region and a third electrical contact connected to said fifth region by an ohmic contact; means to apply a signal to said fifth region to reverse bias said fourth rectifying junction sufficiently to produce breakdown thereof and to place said switch in the conductive state.

References Cited by the Examiner

UNITED STATES PATENTS

| | | | |
|---|---|---|---|
| 2,919,388 | 12/59 | Ross | 317—235 |
| 2,967,793 | 1/61 | Phillips | 317—235 |

OTHER REFERENCES

Applications and Circuit Design Notes, Bulletin D 420–02–8–59, Solid State Products, Inc., Salem, Mass., August 1959 p. 14.

JOHN W. HUCKERT, *Primary Examiner.*